United States Patent
Park et al.

(10) Patent No.: US 9,504,146 B2
(45) Date of Patent: Nov. 22, 2016

(54) HEAT RADIATION PRINTED CIRCUIT BOARD, METHOD OF MANUFACTURING THE SAME, BACKLIGHT UNIT INCLUDING THE SAME, AND LIQUID CRYSTAL DISPLAY DEVICE

(71) Applicant: LG INNOTEK CO., LTD., Seoul (KR)

(72) Inventors: Hyun Gyu Park, Seoul (KR); In Hee Cho, Seoul (KR);
(Continued)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/367,779

(22) PCT Filed: Dec. 17, 2012

(86) PCT No.: PCT/KR2012/011019
§ 371 (c)(1),
(2) Date: Jun. 20, 2014

(87) PCT Pub. No.: WO2013/094950
PCT Pub. Date: Jun. 27, 2013

(65) Prior Publication Data
US 2015/0289358 A1    Oct. 8, 2015

(30) Foreign Application Priority Data
Dec. 21, 2011  (KR) .......................... 10-2011-0139183

(51) Int. Cl.
*G02F 1/1335* (2006.01)
*H05K 1/02* (2006.01)
(Continued)

(52) U.S. Cl.
CPC ............. *H05K 1/028* (2013.01); *G02B 6/0073* (2013.01); *G02B 6/0083* (2013.01);
(Continued)

(58) Field of Classification Search
CPC ............................ H05K 1/028; G02B 6/0085
(Continued)

(56) References Cited

U.S. PATENT DOCUMENTS

| RE40,130 E * | 3/2008 | Hasegawa et al. ............. 349/58 |
| 7,599,020 B2 * | 10/2009 | Yang ............................... 349/61 |

(Continued)

FOREIGN PATENT DOCUMENTS

| JP | H07-46756 B2 | 5/1995 |
| KR | 10-2007-0053517 A | 5/2007 |

(Continued)

OTHER PUBLICATIONS

International Search Report in International Application No. PCT/KR2012/011019, filed Dec. 17, 2012.
(Continued)

*Primary Examiner* — Lucy Chien
(74) *Attorney, Agent, or Firm* — Saliwanchik, Lloyd & Eisenschenk

(57) ABSTRACT

Provided are a heat radiation printed circuit board and a method of manufacturing the same, the heat radiation printed circuit board being produced by the method including: forming a circuit layer having an insulating layer, a circuit pattern and a solder resist on a first area of one surface of a metal substrate; and forming a bending part in a second area, in which the insulating layer is not formed, by bending the metal substrate, whereby a crack can be prevented in advance from being generated in the insulating layer, and durability and reliability of the heat radiation printed circuit board and a backlight unit applying the same can be improved.

16 Claims, 7 Drawing Sheets

(72) Inventors: Seung Kwon Hong, Seoul (KR); Min Jae Kim, Seoul (KR); Hyuk Soo Lee, Seoul (KR)

(51) Int. Cl.
  *F21V 8/00* (2006.01)
  *H05K 1/05* (2006.01)
  *H05K 1/09* (2006.01)
  *H01L 25/075* (2006.01)
  *H01L 33/64* (2010.01)

(52) U.S. Cl.
  CPC ......... *G02B 6/0085* (2013.01); *H01L 33/642* (2013.01); *H05K 1/056* (2013.01); *H05K 1/09* (2013.01); *G02F 2001/133628* (2013.01); *H01L 25/0753* (2013.01); *H01L 33/641* (2013.01); *H01L 2224/73204* (2013.01); *H01L 2924/0002* (2013.01); *H01L 2933/0075* (2013.01); *H05K 1/0203* (2013.01); *H05K 2201/10106* (2013.01); *H05K 2201/10136* (2013.01); *H05K 2203/302* (2013.01)

(58) Field of Classification Search
  USPC .......................................................... 349/65
  See application file for complete search history.

(56) References Cited

U.S. PATENT DOCUMENTS

| | | | |
|---|---|---|---|
| 2004/0090568 A1* | 5/2004 | Iijima | G02F 1/133528 349/65 |
| 2007/0121023 A1 | 5/2007 | Yang | |
| 2009/0316072 A1* | 12/2009 | Okumura et al. | 349/64 |
| 2011/0025944 A1* | 2/2011 | Lee | G02B 6/0036 349/61 |
| 2012/0111621 A1* | 5/2012 | Ohigashi | B32B 15/08 174/258 |

FOREIGN PATENT DOCUMENTS

| | | |
|---|---|---|
| KR | 10-1028341 B1 | 4/2011 |
| KR | 10-2011-0051718 A | 5/2011 |

OTHER PUBLICATIONS

Office Action dated Dec. 17, 2015 in Chinese Application No. 201280064185.1.

* cited by examiner

Fig. 1
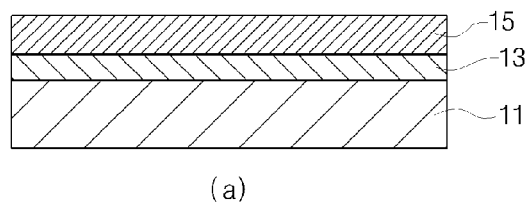
(a)
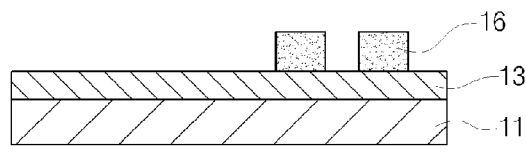
(b)
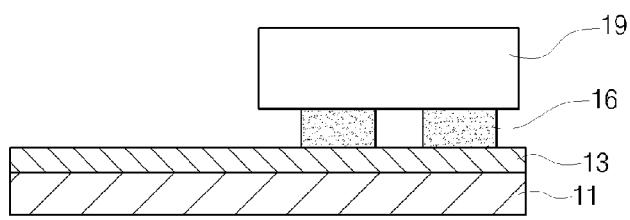
(c)
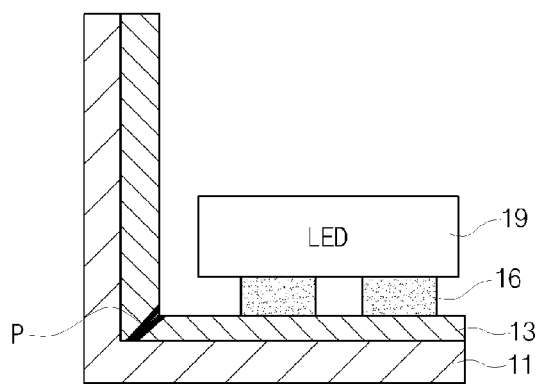
(d)

(a)

(b)

HEAT RADIATION PRINTED CIRCUIT BOARD, METHOD OF MANUFACTURING THE SAME, BACKLIGHT UNIT INCLUDING THE SAME, AND LIQUID CRYSTAL DISPLAY DEVICE

CROSS-REFERENCE TO RELATED APPLICATIONS

This application is the U.S. national stage application of International Patent Application No. PCT/KR2012/011019, filed Dec. 17, 2012, which claims priority to Korean Application No. 10-2011-0139183, filed Dec. 21, 2011, the disclosures of each of which are incorporated herein by reference in their entirety.

TECHNICAL FIELD

This application claims priority to Korean Patent Application No. 10-2011-0139183, filed on Dec. 21, 2011, in the Korean Intellectual Property Office, the entire contents of which are hereby incorporated by reference.

The present invention relates to a technical field of a heat radiation printed circuit board.

BACKGROUND ART

As the electronic device industry was developed, various display devices have been developed, and an image device, a computer, a mobile communication terminal and the like using the same have been developed. A liquid crystal display (LCD) device, which appeared according to this trend, is drawing attention as the display device of a monitor, a mobile communication terminal and the like.

The liquid crystal display (LCD) device is to apply an electrical and optical property of liquid crystal having a middle characteristic of liquid and solid to a display device. Furthermore, the liquid crystal display device is an electric device which converts various kinds of electrical information generated from various devices into visual information using a variation in transmittance of the liquid crystal according to on an applied voltage and transmits the converted visual information. The liquid crystal display device is a flat display device which is being widely used because it has a low operation voltage and electric power consumption and is convenient to carry.

Since the LCD has no self-luminosity to emit light for itself, a backlight is always required for the LCD. The backlight serves as a light source of the LCD. A backlight unit is a composite composed of a light source for radiating light to a rear surface of a liquid crystal module, an electric power circuit for driving the light source, and all components for forming uniform plane light. The backlight unit using a light emitting diode (LED) has been recently suggested as a light source to illuminate the LCD. The LED is a light emitting device which generates light using a light emitting phenomenon generated when a voltage is applied to a semiconductor. The LED has a small size and a long lifespan compared to a conventional light source. Furthermore, it is advantageous that since the LED directly converts electric energy into light energy, it has a low operation voltage at the same time as having high energy efficiency. The backlight unit is used in a state in which a plurality of light emitting devices such as the LED are mounted on a printed circuit board (PCB). Since the printed circuit board should endure heat emitted from the light emitting device, it is mainly formed of a metal material. However, when the heat generated from the light emitting device is not properly emitted, the light emitting device is destroyed or a life span thereof is reduced. Thus, to ensure the heat generated from the light emitting device to be easily emitted, the structure of a metal printed circuit board and the structure of a backlight unit including the same, as described in Korean Patent Laid-Open Publication No. 10-2007-0053517, were suggested.

FIG. 1 simply illustrates a general method of manufacturing a metal printed circuit board as described in aforesaid Korean Patent Laid-Open Publication No. 10-2007-0053517. Referring to FIG. 1, as illustrated in (a) of FIG. 1, an insulating layer 13 and a metal layer 15 are first laminated on an upper front surface of a metal substrate 11 composed of Al or a copper alloy. Furthermore, as illustrate in (b) of FIG. 1, a circuit pattern 16 is formed by patterning the metal layer 15. As illustrated in (c) of FIG. 1, a light emitting device 19 is mounted on the circuit pattern 16. As illustrated in (d) of FIG. 1, an L-shaped metal printed circuit board is formed by bending the metal substrate 11.

However, in the conventional metal printed circuit board having the structure as illustrated in (d) of FIG. 1, as the insulating layer 13 is formed on the front surface of the metal substrate 11, when bending is formed, due to a frangible property (i.e. a brittle property) of the insulating layer itself, a crack is generated at a part P in which the bending is formed. Thus, it is problematic that when a backlight unit is produced using the aforesaid metal printed circuit board, foreign substances generated from the crack of the insulating layer can be entered into an inner part of the backlight unit. Furthermore, as time passes, the crack becomes to grow. Thus, it is problematic that a defect in the circuit pattern can be generated, and that durability and reliability of the backlight unit are reduced.

DISCLOSURE OF INVENTION

Technical Problem

The present invention has been proposed to solve the drawbacks as described in the forgoing. An aspect of the present invention provides a method of manufacturing a heat radiation printed circuit board, and a heat radiation printed circuit board manufactured by the method, which is configured such that a circuit layer having an insulating layer, a circuit pattern and a solder resist is formed on a first area of one surface of a metal substrate, and a bending part is formed between the first area and a second area, in which the insulating layer is not formed, by bending the metal substrate, thereby enabling the durability and reliability of a backlight unit to be improved.

Solution to Problem

According to an aspect of the present invention, there is provided a method of manufacturing a heat radiation printed circuit, including: forming a circuit layer having an insulating layer, a circuit pattern and a solder resist on a first area of one surface of a metal substrate; and forming a bending part in a second area, in which the insulating layer is not formed, by bending the metal substrate.

According to the method of the heat radiation printed circuit board, the forming of the circuit layer may include: forming the insulating layer on the second area and the first area of one surface of the metal substrate; forming a metal layer on the insulating layer; forming a circuit pattern at an upper side of the first area by patterning the metal layer;

applying a solder resist to the first area in which the circuit pattern is formed; and removing the insulating layer formed on the second area.

According to the method of the heat radiation printed circuit board, the forming of the circuit layer may include: forming the insulating layer on the first area of one surface of the metal substrate; forming the metal layer on the insulating layer; forming the circuit pattern at the upper side of the first area by patterning the metal layer; and applying the solder resist to the first area in which the circuit pattern is formed.

According to the method of the heat radiation printed circuit board, the forming of the circuit layer may include: forming the metal layer on the insulating layer; forming the circuit pattern by patterning the metal layer; producing the circuit layer by applying the solder resist to the first area in which the circuit pattern is formed; and laminating the circuit layer on the first area of one surface of the metal substrate.

According to the method of the heat radiation printed circuit board, the insulating layer may be formed in a film shape or a tape shape.

According to the method of the heat radiation printed circuit board, the insulating layer may be composed of at least one material of a polyimide resin, a polyester resin, an epoxy resin and a phenolic resin.

According to the method of the heat radiation printed circuit board, the metal layer may be formed of a material including Cu.

According to the method of the heat radiation printed circuit board, the metal substrate may be formed of a material including Al.

According to the method of the heat radiation printed circuit board, a plurality of holes formed at regular intervals may be provided on the bending part of the metal substrate.

According to the method of the heat radiation printed circuit board, a groove may be formed on the bending part of the metal substrate.

According to the method of the heat radiation printed circuit board, the groove may have a cross section in a rectangular shape or a V-shape. However, the present invention is not limited to this.

According to another aspect of the present invention, there is provided a heat radiation printed circuit board, including: a metal substrate having a first area and a second area on one surface thereof; an insulating layer formed on the first area of the metal substrate; a circuit pattern formed on the insulating layer; and a solder resist applied to the first area in which the circuit pattern is formed, wherein the metal substrate is configured in a structure in which a bending part is formed in the second area in which the insulating layer is not formed.

According to the heat radiation printed circuit board according to the present invention, the circuit pattern may be formed of a material including Cu.

According to the heat radiation printed circuit board according to the present invention, the metal substrate may be formed of a material including Al.

According to the heat radiation printed circuit board according to the present invention, the insulating layer may be formed in a film shape or a tape shape.

According to the heat radiation printed circuit board according to the present invention, the insulating layer may be composed of at least one material of a polyimide resin, a polyester resin, an epoxy resin, and a phenolic resin.

According to the heat radiation printed circuit board according to the present invention, a plurality of holes formed at regular intervals may be provided on the bending part of the metal substrate.

According to the heat radiation printed circuit board according to the present invention, a groove may be formed on the bending part of the metal substrate.

According to the heat radiation printed circuit board according to the present invention, the groove may have a cross section in a rectangular shape or a V-shape. However, the present invention is not limited to this.

According to the heat radiation printed circuit board according to the present invention, the metal layer may be formed of a material including Cu.

According to still another aspect of the present invention, there is provided a backlight unit, including: a light emitting device; a light guide plate which converts light incident from the light emitting device into a surface light source and emits the converted surface light source; a heat radiation printed circuit board including a metal substrate having a first area and a second area on one surface thereof, an insulating layer formed on the first area of the metal substrate, a circuit pattern formed on the insulating layer, and a solder resist applied to the first area in which the circuit pattern is formed; and a chassis structure in which the light emitting device, the light guide plate and the heat radiation printed circuit board are received, wherein a bending part is formed in the heat radiation printed circuit substrate so that the first area is parallel to an incident surface of the light guide plate and the second area is parallel to a light emitting surface of the light guide plate.

According to the backlight unit of the present invention, the second area may be formed in a structure which comes into surface contact with the chassis structure. The present invention is not limited to this.

According to the backlight unit of the present invention, the circuit pattern may be formed of a material including Cu.

According to the backlight unit of the present invention, the metal substrate may be formed of a material including Al.

According to the backlight unit of the present invention, the light emitting device may be composed of a light emitting diode (LED).

According to another aspect of the present invention, there is provided a liquid crystal display device, including: a liquid crystal display panel; a backlight unit having a structure in which light is supplied to the liquid crystal display panel; and a plurality of optical sheets included in an upper portion or a lower portion of the liquid crystal display panel, or in the backlight unit.

Advantageous Effects of Invention

According to the present invention, it is advantageous that since a possibility of generation of the crack in the insulating layer is prevented in advance, reliability and physical durability of the backlight unit can be improved.

Also, according to the present invention, it is advantageous that as the insulating layer is formed only on the area in which the circuit pattern is provided, a raw material can be reduced, and thus a production cost can be reduced.

Moreover, according to the present invention, the bending is formed so that the metal substrate comes into contact with the chassis structure. Thus, by mounting the light emitting device on the metal substrate, heat generated from the light emitting device can be efficiently emitted.

BRIEF DESCRIPTION OF DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIG. 1 is an exemplary view of process illustrating a process of manufacturing a heat radiation printed circuit board according to a conventional art.

MODE FOR THE INVENTION

Hereinafter, preferred embodiments of the present invention will be described in detail with reference to the accompanying drawings in such a manner that the present could be easily implemented by those having ordinary skill in the art to which the present invent pertains. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the following description, it is to be noted that, when the functions of conventional elements and the detailed description of elements related with the present invention may make the gist of the present invention unclear, a detailed description of those elements will be omitted. The terminology used herein is for the purpose of describing particular embodiments only and is not intended to be limiting of example embodiments. Like numbers refer to like or similar elements throughout the drawings and specification.

A method of manufacturing a heat radiation printed circuit board according to the present invention includes: forming a circuit layer having an insulating layer, a circuit pattern and a solder resist on a first area of one surface of a metal substrate; and forming a bending part between the first area and a second area in which the insulating layer is not formed, by bending the metal substrate.

In particular, the process of forming the circuit layer having the insulating layer, the circuit pattern and the solder resist on the first area of one surface of the metal substrate may be implemented by a first exemplary embodiment to a third exemplary embodiment which will be hereinafter explained. The circuit layer in the present invention means a layer including the insulating layer, the circuit pattern and the solder resist.

Figure 2:
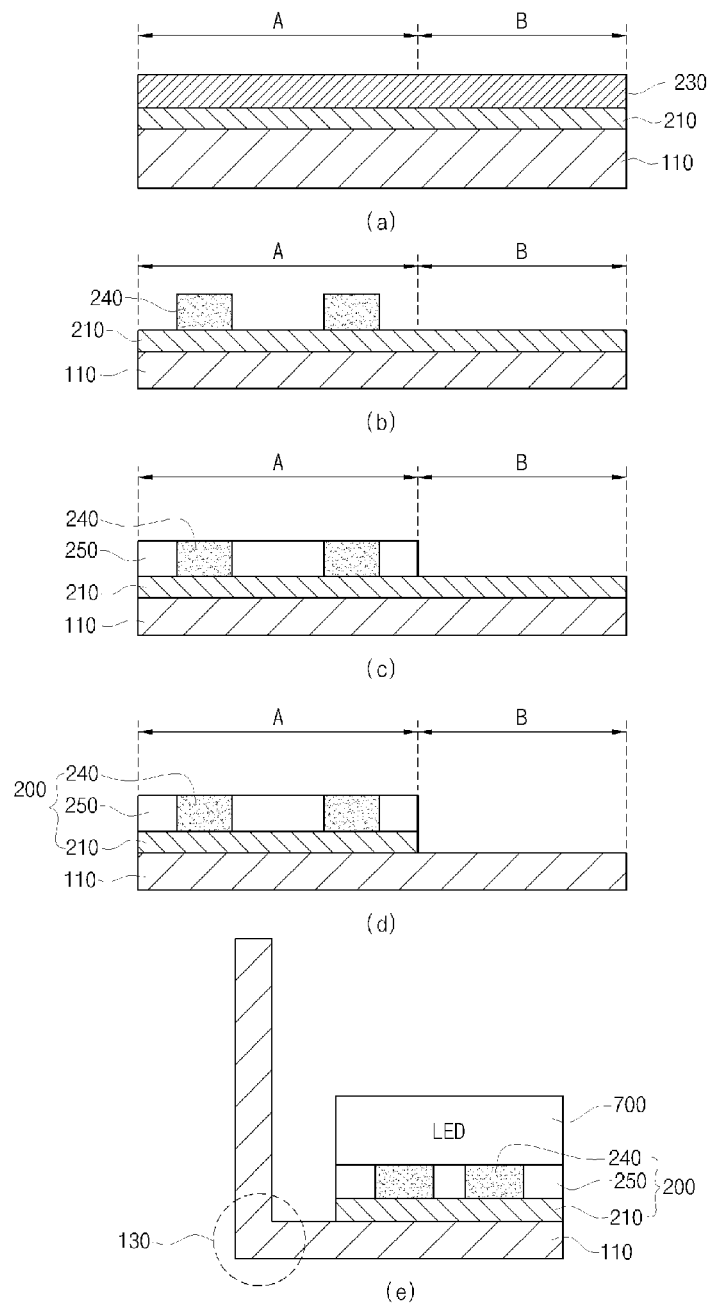
FIG. 2 is an exemplary view of process illustrating a process of manufacturing a heat radiation printed circuit board according to a first exemplary embodiment of the present invention.

FIG. 2 is an exemplary view of process illustrating a process of manufacturing a heat radiation printed circuit board according to a first exemplary embodiment of the present invention. Referring to FIG. 2, according to a method of manufacturing a heat radiation printed circuit board according to the present exemplary embodiment, a metal substrate 110 is first prepared. At this time, the metal substrate 110 may be formed of a material high thermal conductivity. In particular, the metal substrate may be formed of Al. However, the present invention is not limited to this. In addition to this, all materials having excellent thermal conductivity may be used. Then, as illustrated in (a) of FIG. 2, an insulating layer 210 and a metal layer 230 are sequentially formed on a first area A and a second area B of one surface of the metal substrate 110.

At this time, the insulating layer 210 may be formed of a material having an excellent insulating property and thermal conductivity. For example, as the material of the insulating layer 210, a polyimide resin may be used. However, the present invention is not limited to this. In addition to this, a polyester resin, an epoxy resin, a phenolic resin and all insulating materials, which were developed and commercialized or will be embodied according to future technical development, may be used.

Meanwhile, the metal layer 230 laminated on the insulating layer 210 may be composed of a material having excellent electric conductivity such as Cu.

Then, as illustrated in (b) of FIG. 2, a circuit pattern 240 is formed on the first area A by patterning the metal layer 230. As illustrated in (c) of FIG. 2, a solder resist 250 is applied to the first area A in which the circuit pattern is formed. This is intended to prevent a solder bridge phenomenon between the respective circuit patterns from being generated at the time of soldering and to protect the circuit pattern 240.

After applying the solder resist 250, as illustrated in (d) of FIG. 2, a circuit layer 200 is formed by removing a part of the insulating layer 210 formed on the second area B from the insulating layer 210. At this time, a method of removing the part of the insulating layer 210 may use a mechanical grinding method such as sanding. However, the present invention is not limited to this.

After removing the insulating layer 210 of the second area B, a bending part 130 is formed by bending a part of the second area B excluding the first area A from the metal substrate 110. Thus, as illustrated in (e) of FIG. 2, the L-shaped heat radiation printed circuit board is produced, and a light emitting device 700 is mounted on the circuit layer 200. At this time, the mounting of the light emitting device 700 may be performed prior to the bending of the metal substrate 110. Meanwhile, the light emitting device 700 may be composed of a light emitting diode (LED). This is because the LED device can have low electric power consumption and a semi-permanent life span and reliability, emitting light having uniform brightness, and implementing various colors. Moreover. The light emitting device 700 of the present invention may be formed as a surface mount device (SMD) so as to be mounted directly on the heat radiation printed circuit board of the present invention. This is, the light emitting device may be formed in a surface mount type. However, the present invention is not limited to this. The L-shaped heat radiation printed circuit board in which the bending is formed may radiate more heat compared to a flat-type heat radiation printed circuit board. This is because the L-shaped heat radiation printed circuit board in which the bending is formed may provide a wider heat radiation area than the flat-type heat radiation printed circuit board.

According to the present exemplary embodiment of the invention as described above, the insulating layer 210 is formed only on the first area A in which the circuit pattern 240 is provided, and the insulating layer 210 formed on the second area B is removed so that the possibility of a crack generated at the insulating layer can be prevented in advance. Thus, as a result, a possibility that a defect in the backlight unit due to the crack will generated can be prevented in advance. Furthermore, reliability and physical durability of the backlight unit can be improved. Moreover, by removing the insulating layer 210 of the second area B before performing the bending process, a possibility of separation between the insulating layer 210 and the metal substrate 110 can be prevented.

Figure 3:
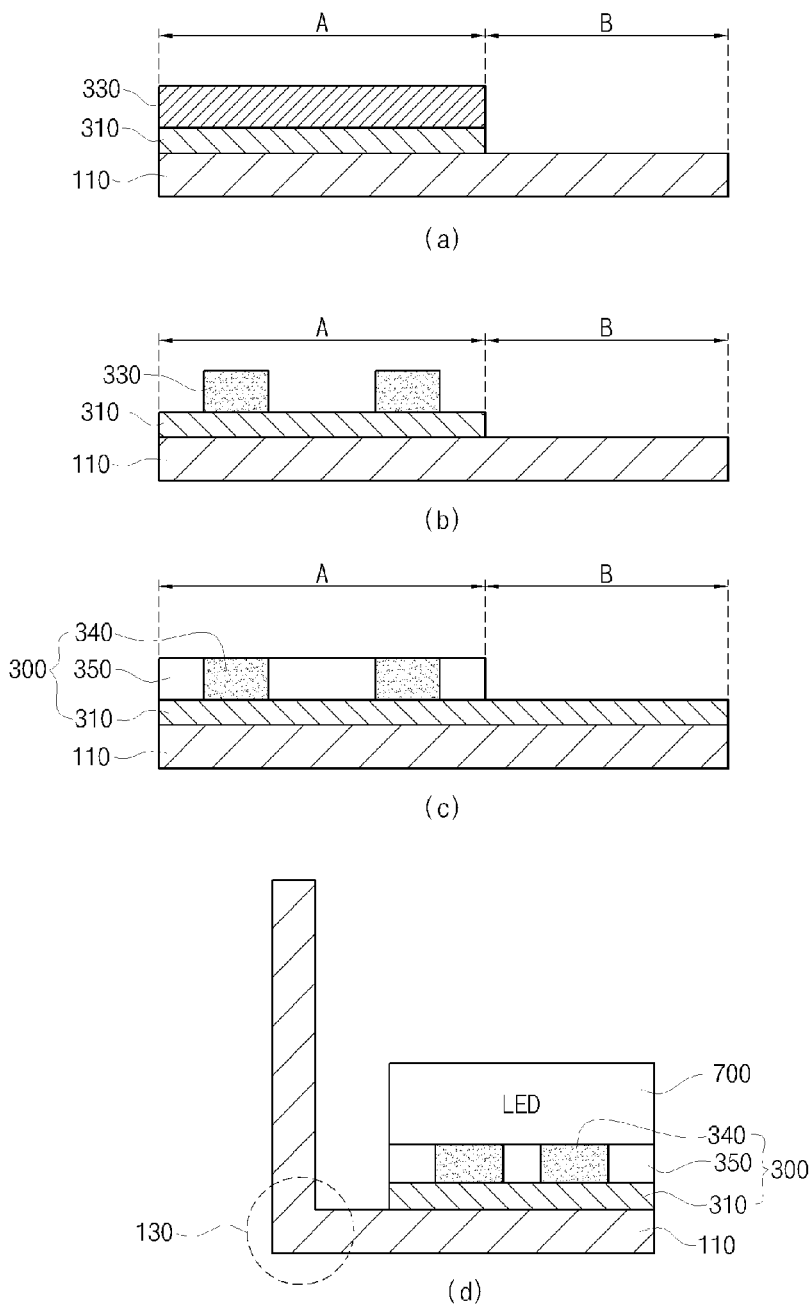
FIG. 3 is an exemplary view of process illustrating a process of manufacturing a heat radiation printed circuit board according to a second exemplary embodiment of the present invention.

FIG. 3 is an exemplary view of process illustrating a process of manufacturing a heat radiation printed circuit board according to a second exemplary embodiment of the present invention.

Referring to FIG. 2 and FIG. 3, the method of manufacturing the heat radiation printed circuit board according to the present exemplary embodiment may be performed as follows. The metal substrate 110 is first prepared. As illustrated in (a) of FIG. 3, an insulating layer 310 and a metal layer 330 previously processed in a size of the first area A are sequentially formed on the first area A of one surface of the metal substrate 110.

Then, as illustrated in (b) of FIG. 3, a circuit pattern 340 is formed on the first area A by patterning the metal layer 330. Furthermore, as illustrated in (c) of FIG. 3, a circuit layer 300 is formed by applying a solder resist 350 to the first area A in which the circuit pattern 340 is formed. Thereafter, as illustrated in (d) of FIG. 3, the bending part 130 is formed by bending the metal substrate 110. Thus, the L-shaped heat radiation printed circuit board is produced. At this time, the mounting of the light emitting device 700 may be performed prior to the bending of the metal substrate 110. Furthermore, it may be performed after the bending as described in FIG. 2. The detailed description on other respective constituent elements is the same as the contents described in the explanation of FIG. 2 and is thus omitted.

According to the present exemplary embodiment, in addition to the effects of the present invention as described in the explanation of FIG. 2, it is advantageous that a raw material a semi-permanent life span and reliability can be reduced because the previously processed insulating layer and the metal layer are formed only on the first area in which the circuit pattern will be provided.

Figure 4:
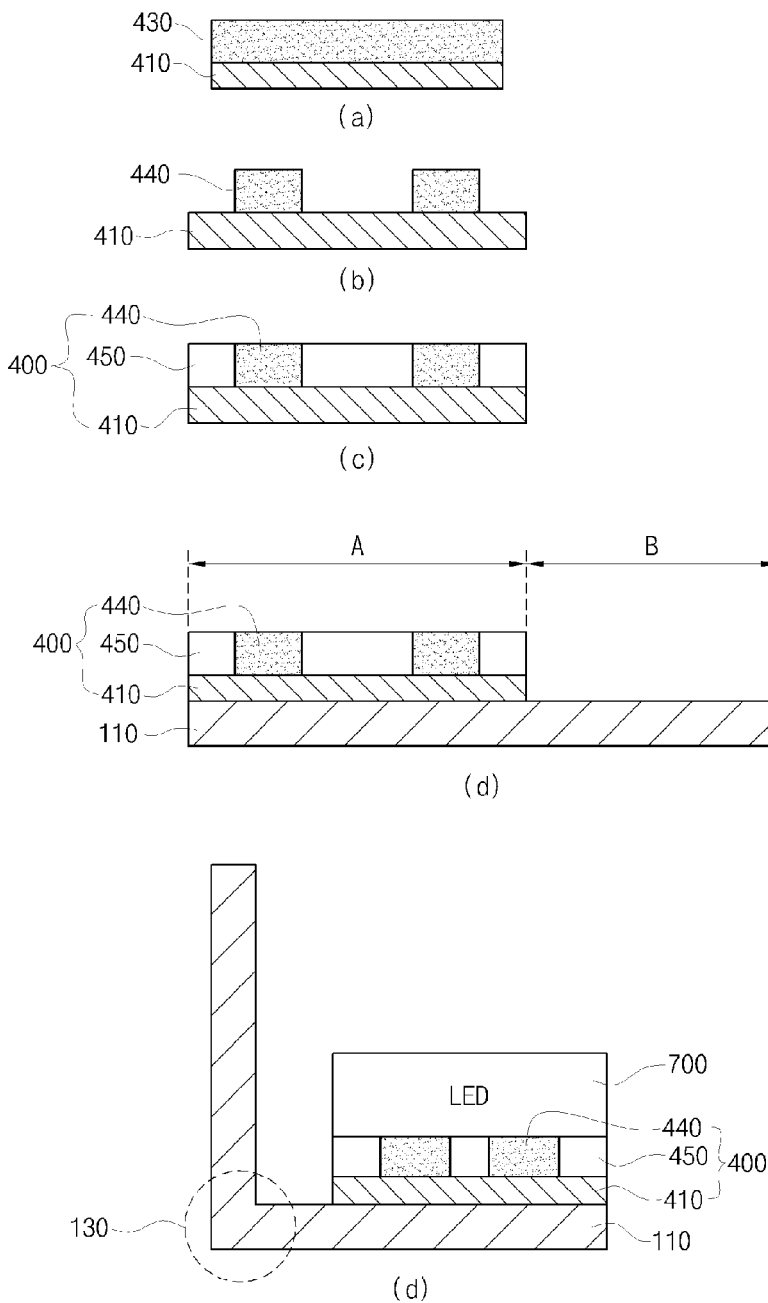
FIG. 4 through FIG. 6 are exemplary views of process illustrating a process of manufacturing a heat radiation printed circuit board according to a third exemplary embodiment of the present invention.
Figure 5:
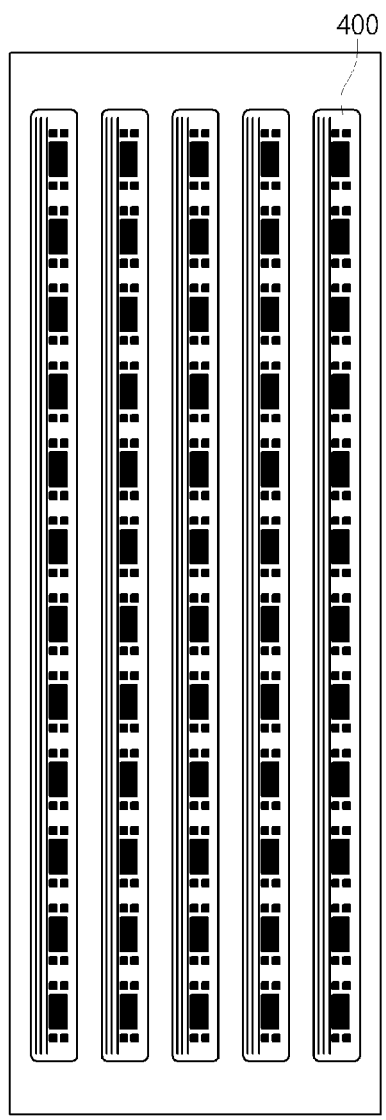
Figure 6:
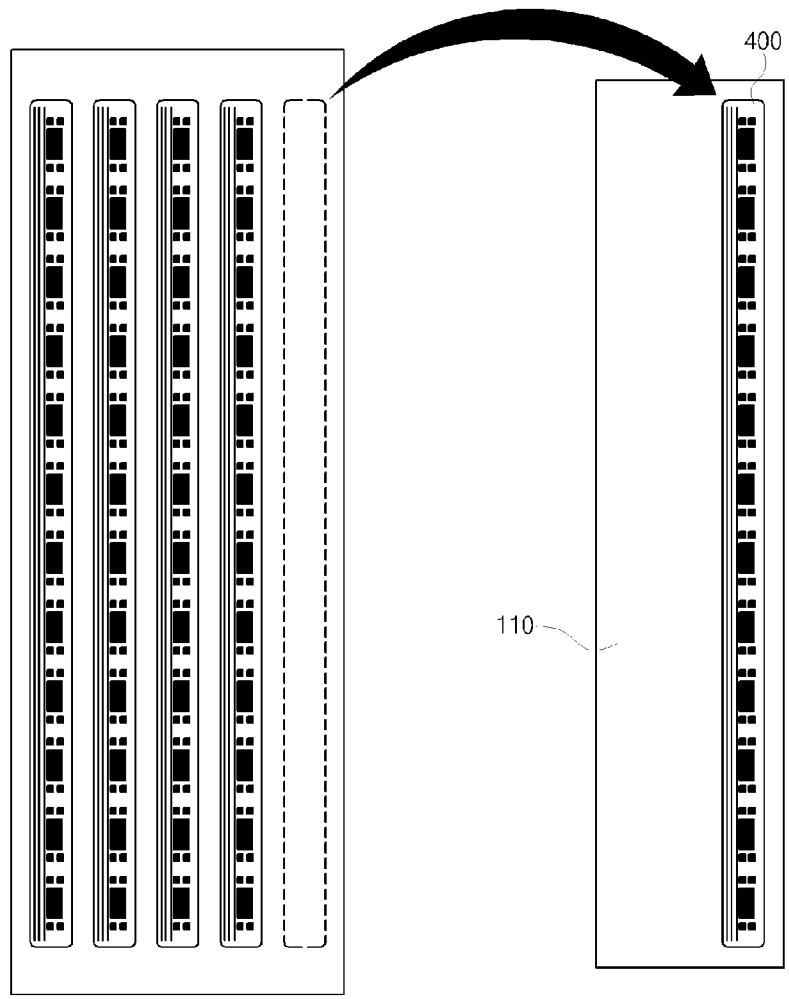

FIG. 4 through FIG. 6 are exemplary views of process illustrating a process of manufacturing a heat radiation printed circuit board according to a third exemplary embodiment of the present invention.

Referring to FIG. 4 to FIG. 6, a method of manufacturing the heat radiation printed circuit board according to the third exemplary embodiment may be performed as follows. As illustrated in (a) of FIG. 4, a metal layer 430 is first laminated on an insulating layer 410. At this time, the insulating layer 410 and the metal layer 430 are in a state of being previously processed in a size corresponding to a first area of the metal substrate. Here, a material of the insulating layer 410 may be composed of all insulating materials which were developed and commercialized or can be embodied according to future technical development. Specifically, a polyimide resin, a polyester resin, an epoxy resin, a phenolic resin and the like may be used. Furthermore, a shape of the insulating layer 410 may be formed in a film shape or a tape shape.

Meanwhile, the laminating of the metal layer 430 may be performed by a method of thermally pressing the metal layer 430 onto the insulating layer 410. In addition to this, the laminating of the metal layer may be performed by all lamination methods which have been developed and commercialized or will be implemented according to future technical development, including a method of bonding the elements using an adhesive.

Then, a circuit pattern 440 is formed on the insulating layer 410 by patterning the metal layer 430. As illustrated in (c) of FIG. 4, a circuit layer 400 is formed by applying a solder resist 450 to the insulating layer 410 in which the circuit pattern 440 is formed. Hereinafter, the circuit layer 400 according to the third exemplary embodiment will be referred to as a tape substrate.

In addition, as illustrated in (d) of FIG. 4, the tape substrate 400 is laminated on the first area A of one surface of the metal substrate 110. At this time, a method of laminating the tape substrate 400 may use a thermal pressure method or a bonding method using an adhesive. However, the present invention is not limited to this. Then, as illustrated in (e) of FIG. 4, the bending part 130 is formed by bending the metal substrate 110, thereby enabling the L-shaped heat radiation printed circuit board to be produced. At this time, the mounting of the light emitting device 700 may be performed before the bending of the metal substrate 110 or after the bending thereof as described in the explanation of FIG. 2. Furthermore, the detailed explanation about each constituent element is the same as the explanation of FIG. 2, and thus is omitted. Meanwhile, the insulating layer used in the third exemplary embodiment may be formed of a material having a similar melting point to a reflow process temperature of a solder ball and is effective to prevent the problem that the tape substrate 400 is separated from the metal substrate 110 during a reflow process which is performed at the time of the mounting of the light emitting device 700.

FIG. 5 and FIG. 6 is a plane view illustrating a process as illustrated in (d) of FIG. 4. According to the third exemplar embodiment, as illustrated in FIG. 5, the tape substrate 400 is dependently produced. As illustrated in FIG. 6, after the tape substrate 400 is laminated on the first area of the metal substrate 110, the heat radiation printed circuit board may be produced by bending the metal substrate 110. Thus, according to the third exemplary embodiment, in addition to the effects of the present invention as described in the explanation of FIG. 2, as the manufacturing process of the circuit layer in which the insulating layer, the circuit pattern and the solder resist are formed, and the bending process of the metal substrate are independently performed, productivity can be remarkably improved, a product can be produced in large quantities, and process efficiency can be also improved.

Figure 7:
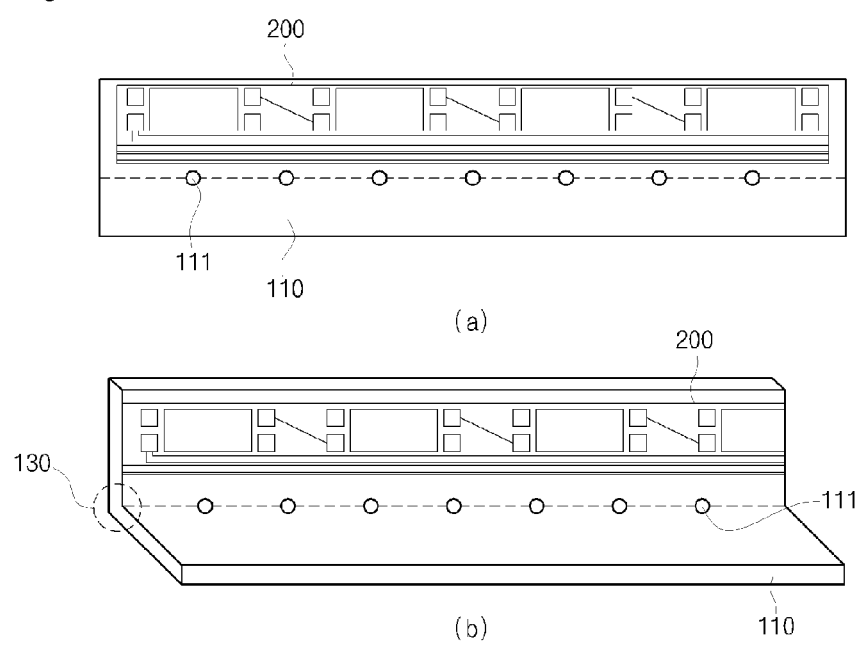
FIG. 7 and FIG. 8 illustrate modified exemplary embodiments regarding a structure of a metal substrate of the present invention.

FIG. 7 illustrates a modified exemplary embodiment regarding a structure of the metal substrate used in the present invention.

Referring to FIG. 7, on the metal substrate 110 according to the present exemplary embodiment, the plurality of holes 111 formed at regular intervals are provided in a part to be bend later as illustrated in (a) of FIG. 7. As illustrated in (b) of FIG. 7, the bending part 130 may be formed by bending the part of the metal substrate 110 in which the holes 111 are formed. A spring back phenomenon is a phenomenon in which a bending amount is reduced due to an elastic action to recovery an original shape when the material is bent and a pressure is then removed from the material during a bending process of the plastic material. When the metal substrate 110 is bent by the bending process, the metal substrate meets with the elastic action to recovery its original flat shape due to the spring back phenomenon. However, according to the present exemplary embodiment, as the plurality of holes are formed on the metal substrate 110, a spring back phenomenon which can be generated at the time of the bending of the metal substrate 110 may be minimized, and an elastic force of the metal substrate 110 may be also reduced. Furthermore, the problem that the optical properties of a light source device are deteriorated due to the bending of the metal substrate 110 may be overcome.

Figure 8:
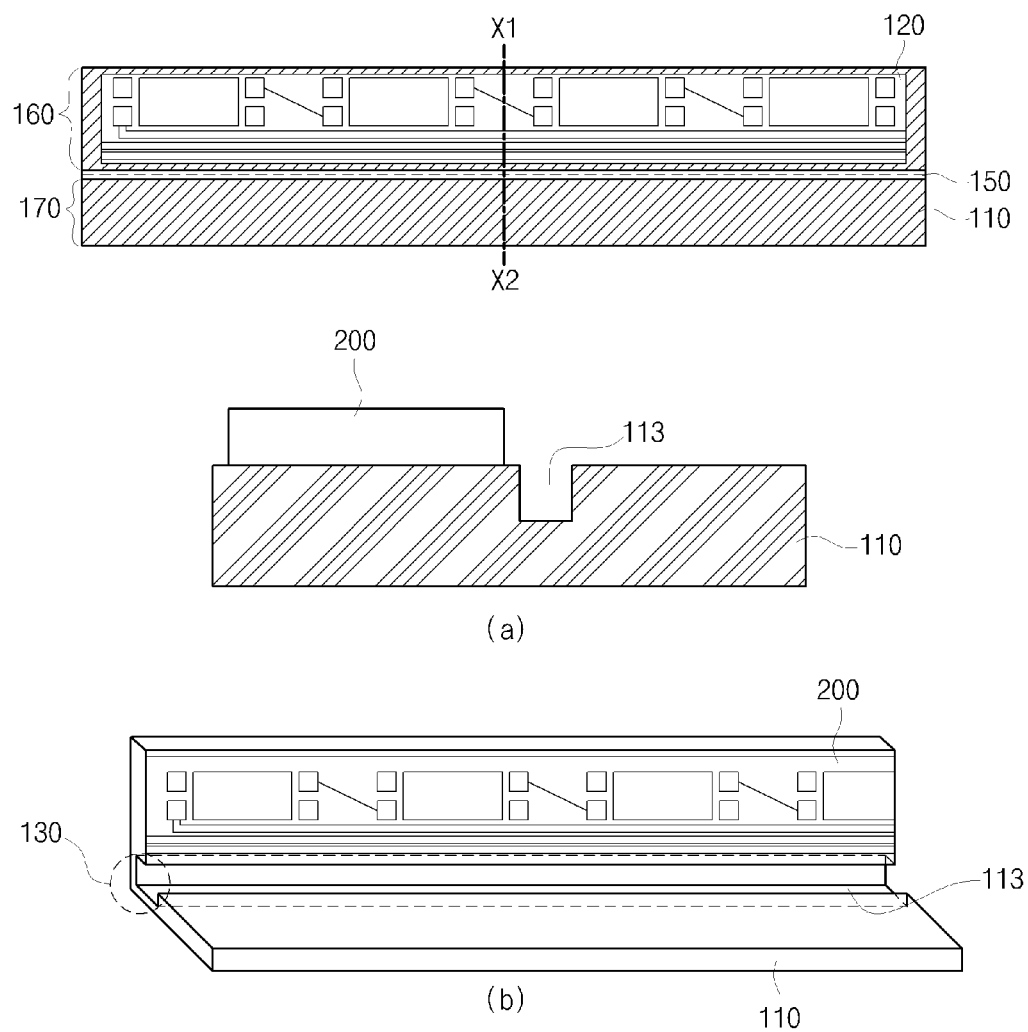

FIG. 8 illustrates a modified exemplary embodiment regarding a structure of the metal substrate of the present invention.

Referring to FIG. 8, as illustrated in (a) of FIG. 8, on the metal substrate 110 according to the present exemplary embodiment, a groove 113 is formed in a part to be bent later. As illustrated in (b) of FIG. 8, the bending part 130 may be formed in the part of the metal substrate 110 in which the groove 113 is formed. Thus, as described in the explanation of FIG. 7, the spring back phenomenon which may be generated at the time of the bending of the metal substrate 110 may be minimized. Furthermore, the problem that the optical properties of a light source device are deteriorated due to the bending of the metal substrate 110 may be overcome.

Meanwhile, the cross-sectional view taken along X1-X2 illustrated in (a) of FIG. 8 illustrates that the cross section of the groove 113 has a rectangular shape. However, this is only one example. The shape may be variously modified in a V-shape, a semicircular shape, a polygonal shape and the like.

Figure 9:
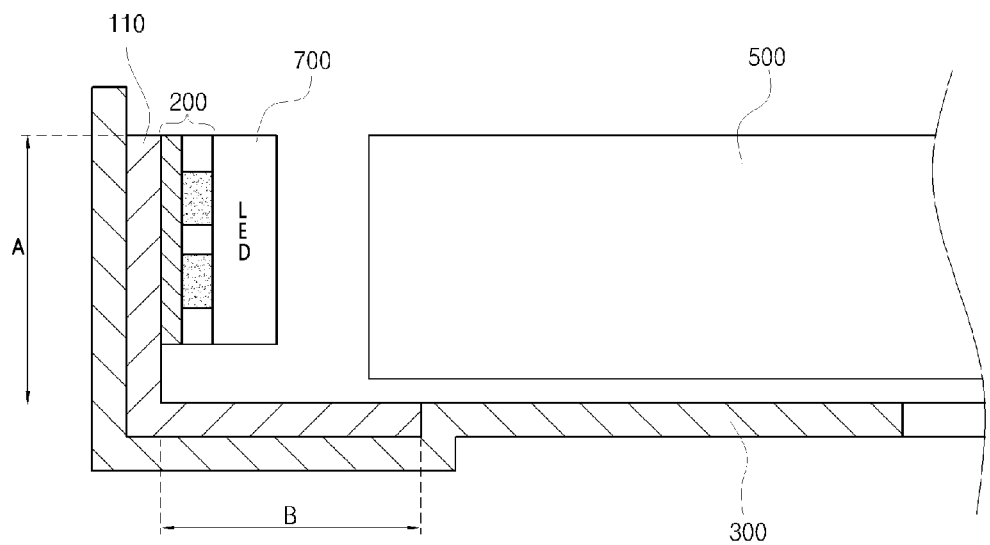
FIG. 9 roughly illustrates a structure of a backlight unit according to the present invention.

FIG. 9 illustrates roughly a structure of a backlight unit according to the present invention. More specifically, FIG. 9 illustrates the structure of a backlight unit to which the heat radiation printed circuit board produced by the method as explained in FIG. 2 to FIG. 6 is applied. Hereinafter, the heat radiation printed circuit board having the shape illustrated in (e) of FIG. 2 will be explained as an example.

Referring to FIG. 9, the backlight unit according to the present invention includes: the heat radiation printed circuit board produced by the method as explained in FIG. 2 to FIG. 6; a chassis structure 600 for providing a light guide passage of the backlight unit and a light emitting device 700 which is mounted to the heat radiation printed circuit board; and a light guide plate 500 which converts light incident from the light emitting device 700 into a surface light source and radiates the converted surface light source so that the light can be supplied to a liquid crystal display panel.

The chassis structure 600 functions to couple and receive each constituent element of the backlight unit into one constituent element. The chassis structure 600 may be formed of a material having excellent durability and heat transmissibility. For example, it may be composed of Al or a copper alloy. However, the present invention is not limited to this.

The heat radiation printed circuit board processed in the L-shape is configured such that the circuit pattern 240 is formed so that the first area A on which the light emitting device 700 is mounted is disposed to be parallel to an incident surface of the light guide plate 500, and the second area B in which the insulating layer is not formed is disposed to be parallel to a light emitting surface of the light guide plate 500.

Furthermore, the second area B may be disposed in a structure which it is in surface contact with a lower part of the chassis structure 600 or a structure which it is bonded to the lower part of the chassis structure 600 by a TIM (not drawn). That is, the chassis structure 600 and the second area B of the heat radiation printed circuit board are disposed to come into contact with each other. Thus, the heat transmitted through the metal substrate 110 is discharged to the outside through the chassis structure 600.

Meanwhile, the first area A may be formed in a structure in which it is in surface contact with a side of the chassis structure 600. Thus, the heat transmitted through the metal substrate 110 is discharged to the outside through the side of the chassis structure 600. Accordingly, heat radiation efficiency can be improved.

Moreover, although it is not illustrated in the drawings, a liquid crystal display device may be implemented using the backlight unit as illustrated in FIG. 9. The liquid crystal display device includes a liquid crystal display panel, the backlight unit having the structure as illustrated in FIG. 9 and for supplying light to the liquid crystal display panel, and a plurality of optical sheets (i.e. a prism sheet, a reflective sheet, a diffusion sheet and the like) included in an upper portion or a lower portion of the liquid crystal display panel, or the backlight unit.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

The invention claimed is:

1. A heat radiation printed circuit board, comprising:
   a metal substrate including a first area and a second area, wherein the first area and the second area form a continuous structure; and
   a circuit layer comprising an insulating layer, a circuit pattern, and a solder resist that is formed only on the first area of one surface of a metal substrate;
   wherein the insulating layer is formed only on the first area of the metal substrate, the circuit pattern is formed on the insulating layer, and a solder resist is applied among the circuit patterns;
   wherein the circuit layer is separated from the second area; and
   wherein the metal substrate includes a bending part that connects the first area and the second area, and wherein the bending part includes a groove or a hole.

2. The printed circuit board of claim 1, wherein the circuit pattern is formed of a material including Cu.

3. The printed circuit board of claim 1, wherein the metal substrate is formed of a material including Al.

4. The printed circuit board of claim 1, wherein the insulating layer is formed in a film shape or a tape shape.

5. The printed circuit board of claim 1, wherein the insulating layer is formed of at least one material of a polyimide resin, a polyester resin, an epoxy resin and a phenolic resin.

6. The printed circuit board of claim 1, wherein the groove or hole is one of a plurality of grooves or holes that are at regular intervals.

7. The printed circuit board of claim 1, wherein the groove has a cross section in a rectangular shape or a V-shape.

8. A backlight unit, comprising:
a light emitting device;
a light guide plate that converts light incident from the light emitting device into a surface light source and emits the converted surface light source;
a heat radiation printed circuit board including: a metal substrate including a first area and a second area, wherein the first area and the second area form a continuous structure; and
a circuit layer comprising an insulating layer, a circuit pattern, and a solder resist that is formed only on the first area of one surface of the metal substrate;
wherein the insulating layer is formed only on the first area of the metal substrate, the circuit pattern is formed on the insulating layer, and a solder resist is applied among the circuit patterns; wherein the circuit layer is separated from the second area;
wherein a bending part that connects the first area and the second area is formed in the heat radiation printed circuit board so that the first area is parallel to an incident surface of the light guide plate, and the second area is parallel to a light emitting surface of the light guide plate;
and wherein the bending part includes a groove or a hole.

9. The backlight unit of claim 8, wherein the second area is in contact with a chassis structure.

10. The backlight unit of claim 8, wherein the circuit pattern is formed of a material including Cu.

11. The backlight unit of claim 8, wherein the metal substrate is formed of a material including Al.

12. A liquid crystal display device, comprising:
a liquid crystal display panel;
the backlight unit according to claim 8 for supplying light to the liquid crystal display panel; and
a plurality of optical sheets included in an upper portion or a lower portion of the liquid crystal display panel, or in the backlight unit.

13. The printed circuit board of claim 1, wherein the circuit pattern and the solder resist are repeatedly formed.

14. The backlight unit of claim 8, wherein the solder resist and the circuit pattern are repeatedly formed.

15. The printed circuit board of claim 1, wherein the groove has a cross section having a semicircular shape.

16. The printed circuit board pattern of claim 13, wherein the groove extends to span a length of the circuit pattern and the solder resist.

* * * * *